(12) United States Patent
Jeong et al.

(10) Patent No.: US 8,681,107 B2
(45) Date of Patent: Mar. 25, 2014

(54) ORGANIC LIGHT EMITTING DISPLAY APPARATUS AND METHOD OF MANUFACTURING THE SAME

(75) Inventors: Beung-Hwa Jeong, Yongin (KR);
Kwang-Nam Kim, Yongin (KR);
Chang-Soo Kim, Yongin (KR);
Young-Ro Jung, Yongin (KR); Yun-Sik Ham, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 878 days.

(21) Appl. No.: 12/659,624

(22) Filed: Mar. 15, 2010

(65) Prior Publication Data

US 2010/0245269 A1    Sep. 30, 2010

(30) Foreign Application Priority Data

Mar. 25, 2009    (KR) .................. 10-2009-0025540

(51) Int. Cl.
*G06F 3/041* (2006.01)

(52) U.S. Cl.
USPC .............. 345/173; 345/76; 428/629; 428/632

(58) Field of Classification Search
USPC .............. 345/76, 173–178; 178/18.01–18.08; 445/46; 428/629, 632
See application file for complete search history.

(56) References Cited

U.S. PATENT DOCUMENTS

| | | | |
|---|---|---|---|
| 2002/0145683 A1* | 10/2002 | Murade et al. | 349/43 |
| 2006/0033016 A1 | 2/2006 | Ogawa et al. | |
| 2008/0176042 A1* | 7/2008 | Nashiki et al. | 428/172 |
| 2009/0084613 A1 | 4/2009 | Yang et al. | |
| 2009/0102813 A1 | 4/2009 | Mamba et al. | |
| 2009/0104440 A1* | 4/2009 | Nashiki et al. | 428/336 |
| 2009/0160819 A1* | 6/2009 | Sasaki et al. | 345/174 |
| 2010/0013745 A1* | 1/2010 | Kim et al. | 345/76 |

FOREIGN PATENT DOCUMENTS

| | | |
|---|---|---|
| JP | 2006-79589 A | 3/2006 |
| KR | 10-2007-0000042 A | 1/2007 |
| KR | 10-2010-0034436 A | 4/2010 |
| WO | WO 2006028131 A1 * | 3/2006 |

OTHER PUBLICATIONS

The Registration Determination Certificate issued by Korean Intellectual Property Office on Jun. 28, 2011, corresponding to Korean Application No. 10-2009-0025540 and Request for Entry of the Accompanying Office Action attached herewith.

* cited by examiner

*Primary Examiner* — Amare Mengistu
*Assistant Examiner* — Stacy Khoo
(74) *Attorney, Agent, or Firm* — Robert E. Bushnell, Esq.

(57) ABSTRACT

An organic light emitting display apparatus includes a substrate; a display unit formed on the substrate and comprising an organic light emitting device; and a touch panel formed on the display unit, wherein the touch panel further includes a sealing substrate, a ground layer formed on a surface of the sealing substrate, a first pattern layer formed on a surface of the sealing substrate opposite to the surface of the sealing substrate on which the ground layer is formed, a first insulating layer formed on the first pattern layer, a second pattern layer formed on the first insulating layer, and a second insulating layer formed on the second pattern layer.

25 Claims, 9 Drawing Sheets

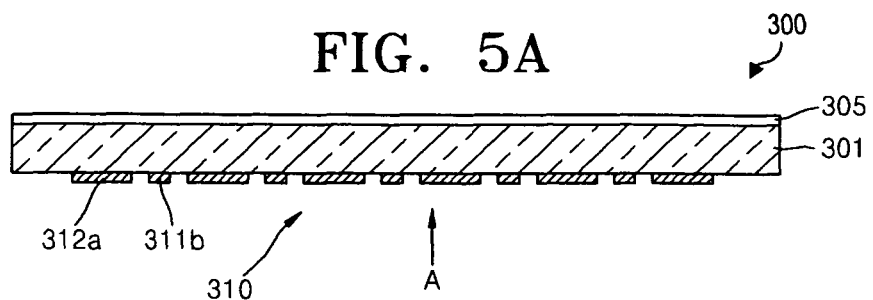
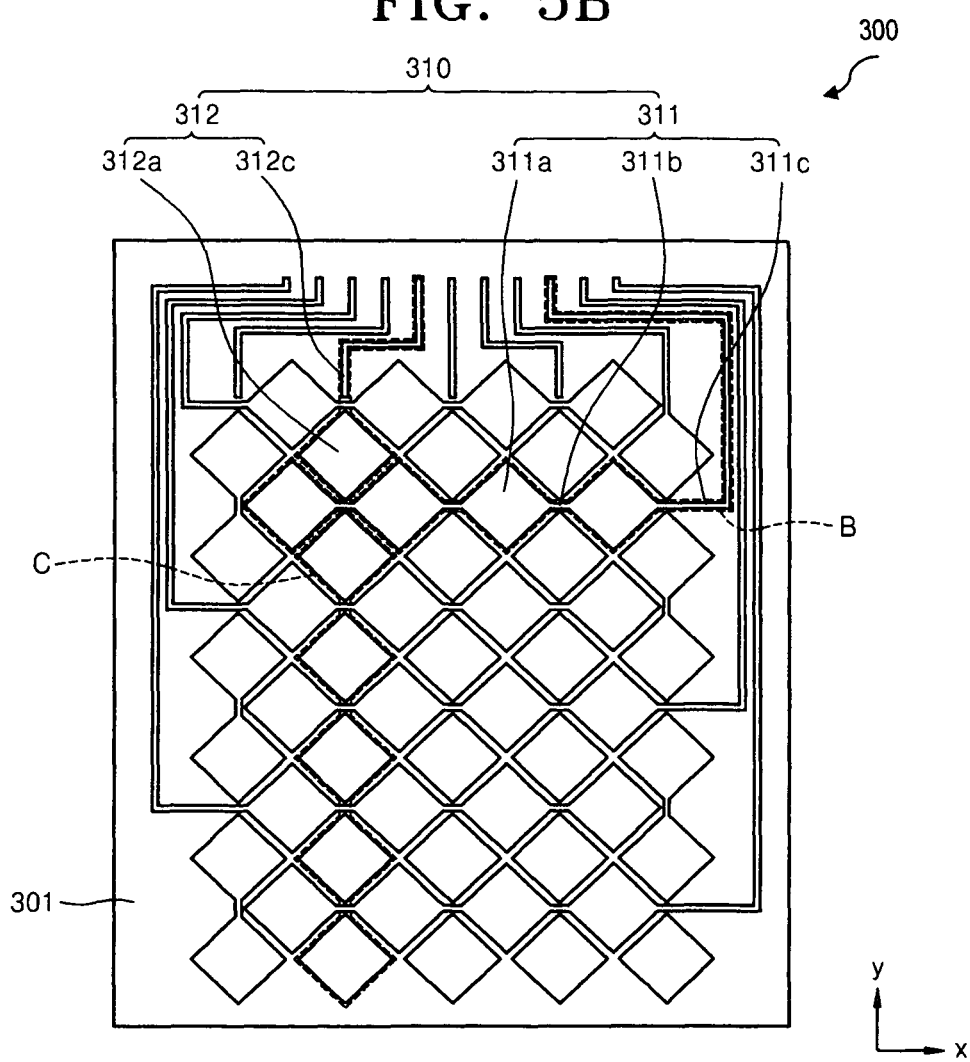

ORGANIC LIGHT EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean intellectual Property Office on 25 Mar. 2009 and there duly assigned Serial No. 10-2009-0025540.

BACKGROUND OF THE INVENTION

1. Field of the Invention

An embodiment of the present invention relates to an organic light emitting display apparatus, and more particularly, to an organic light emitting display apparatus having a capacitive touch panel function and a method of manufacturing the organic light emitting display apparatus.

2. Description of the Related Art

In recent years, display apparatuses have been replaced by portable thin flat panel display apparatuses. One example of such portable thin flat panel display apparatuses is electroluminescent display apparatuses. Electroluminescent display apparatuses are self-emitting display apparatuses which have a wide viewing angle, good contrast, and rapid response speed. Therefore, the electroluminescent display apparatuses have been spotlighted as next generation display apparatuses. In particular, an organic light emitting display apparatus which include a light emitting layer formed of an organic material can exhibit better brightness, lower driving voltages, and faster response speed characteristics in comparison with inorganic light emitting display apparatuses, and thus can realize multicolored images.

Many attempts are being made for applying a touch panel to such organic light emitting display apparatuses. When a touch panel is applied to an organic light emitting display apparatus, the organic light emitting display apparatus may function not only as a display device but also as an input device that enables a user to input data on a panel of the display device with a finger or a pen.

Therefore, researchers recently propose an organic light emitting display apparatus which has a capacitive touch panel function. Due to high precision in the manufacture of such organic light emitting display apparatus and high precision in structure of the organic light emitting display apparatus, it is however difficult to apply a capacitive touch panel to the organic light emitting display apparatus, thereby failing to ensure high yield and high quality during the manufacture of the organic light emitting display apparatus.

SUMMARY OF THE INVENTION

It is therefore an aspect of the present invention to provide an improved organic light emitting display apparatus which has a touch panel function, and to provide a method of manufacturing the organic light emitting display apparatus in order to solve the aforementioned problems such as the difficulty of precisely mounting a capacitive touch panel onto the organic light emitting display apparatus.

According to an aspect of the present invention, an organic light emitting display apparatus includes a substrate; a display unit which is formed on the substrate and which has an organic light emitting device; and a touch panel formed on the display unit, wherein the touch panel includes a sealing substrate, a ground layer formed on a surface of the sealing substrate, a first pattern layer formed on a surface of the sealing substrate opposite to the surface of the sealing substrate on which the ground layer is formed, a first insulating layer formed on the first pattern layer, a second pattern layer formed on the first insulating layer, and a second insulating layer formed on the second pattern layer.

The ground layer may be formed on a surface of the sealing substrate opposite to the surface of the sealing substrate facing the display unit.

The ground layer may be formed on a surface of the sealing substrate facing the display unit.

The ground layer may be crystallized.

The second pattern layer may be crystallized.

Each of the first pattern layer, the second pattern layer, and the ground layer may include a transparent conductive layer.

Each of the first pattern layer, the second pattern layer, and the ground layer may include any one selected from the group consisting of indium tin oxide (ITO), indium zinc oxide (IZO), zinc oxide (ZnO), aluminum-doped zinc oxide (AZO), and indium oxide ($In_2O_3$).

The first pattern layer may include a plurality of first pads, a plurality of first connections each connecting adjacent first pads of the plurality of first pads, and a plurality of second pads.

The first insulating layer may have contact holes formed therein, and the second pattern layer may be connected to the plurality of second pads through the contact holes.

The organic light emitting display apparatus may further include connecting units formed on the substrate and electrically connected to the first pattern layer or the second pattern layer, wherein each of the connecting units includes any one selected from the group consisting of Mo, Al, and Ti.

According to another aspect of the present invention, a method of manufacturing an organic light emitting display apparatus, includes steps of preparing a substrate on which a display unit including an organic light emitting device is formed; and forming a touch panel on the display unit, wherein the step of forming of the touch panel further includes preparing a sealing substrate, forming a ground layer on a surface of the sealing substrate, forming a first pattern layer on a surface of the sealing substrate opposite to the surface of the sealing substrate on which the ground layer is formed, forming a first insulating layer on the first pattern layer, forming a second pattern layer on the first insulating layer, and forming a second insulating layer on the second pattern layer.

The ground layer may be formed on a surface of the sealing substrate opposite to a surface of the sealing substrate facing the display unit.

The ground layer may be formed on a surface of the sealing substrate facing the display unit.

The method may further include a step of crystallizing the ground layer between the forming of the ground layer and a step of forming of the first pattern layer.

The crystallizing of the ground layer may include a step of crystallizing the ground layer using thermal treatment.

The forming of the first pattern layer may include a step of patterning the first pattern layer using wet etching.

The method may further include a step of crystallizing the second pattern layer between the forming of the second pattern layer and a step of forming of the second insulating layer.

The crystallizing of the second pattern layer may include a step of crystallizing the second pattern layer using thermal treatment.

Each of the first pattern layer, the second pattern layer, and the ground layer may include a transparent conductive layer.

Each of the first pattern layer, the second pattern layer, and the ground layer may include any one selected from the group consisting of ITO, IZO, ZnO, AZO, $In_2O_3$.

The first pattern layer may include a plurality of first pads, first connections each connecting adjacent first pads of the plurality of first pads, and a plurality of second pads.

The first insulating layer may have contact holes formed therein, and the second pattern layer is connected to the plurality of second pads through the contact holes.

The method may further include a steep of forming connecting units on the substrate so that the connecting units are electrically connected to the first pattern layer or the second pattern layer, wherein each of the connecting units includes any one selected from the group consisting of Mo, Al, and Ti.

Each of the connecting units may be formed using wet etching or dry etching.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 3A through 9B are cross-sectional views illustrating a method of manufacturing the organic light emitting display apparatus of FIG. 1, according to the one embodiment of the present invention;

DETAILED DESCRIPTION OF THE INVENTION

The present invention will now be described more fully with reference to the accompanying drawings, in which exemplary embodiments of the invention are shown.

Figure 1:
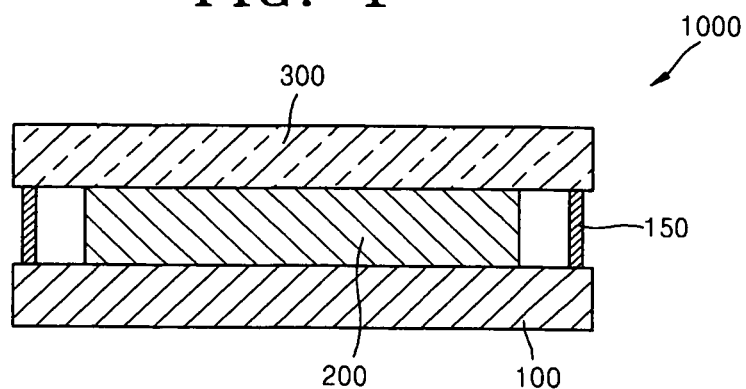
FIG. 1 is a cross-sectional view of an organic light emitting display apparatus constructed as one embodiment of the present invention.
Figure 2:
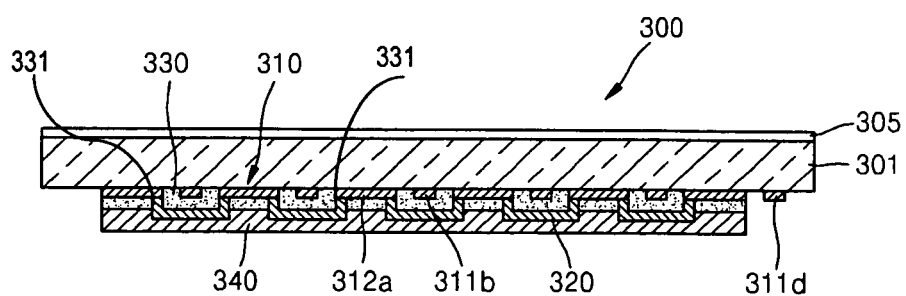
FIG. 2 is an enlarged cross-sectional view of a touch panel of the organic light emitting display apparatus as shown in FIG. 1.

FIG. 1 is a cross-sectional view of an organic light emitting display apparatus 1000 constructed as one embodiment of the present invention. FIG. 2 is an enlarged cross-sectional view of a touch panel 300 of organic light emitting display apparatus 1000 as shown in FIG. 1. FIGS. 3A through 9B are cross-sectional views illustrating a method of manufacturing the organic light emitting display apparatus of FIG. 1 according to the one embodiment of the present invention.

Referring to FIG. 1, organic light emitting display apparatus 1000 includes a substrate 100, a display unit 200, and touch panel 300.

Substrate 100 may be formed of a transparent glass material having $SiO_2$ as a main component. The present invention is however not limited thereto, and substrate 100 may be formed of a transparent plastic material. If substrate 100 is formed of a transparent plastic material, the transparent plastic material may be an organic material selected from the group consisting of polyethersulphone (PES), polyacrylate (PAR), polyetherimide (PEI), polyethylene napthalate (PEN), polyethyelenetereptalate (PET), polyphenylene sulfide (PPS), polyallylate, polyimide, polycarbonate (PC), cellulose triacetate (TAC), and cellulose acetate propionate (CAP).

If organic light emitting display apparatus 1000 is of a bottom-emission type in which an image is formed on substrate 100, substrate 100 should be formed of a transparent material. If organic light emitting display apparatus 1000 is of a top-emission type in which an image is formed on a side opposite to substrate 100, however, substrate 100 is not necessarily formed of a transparent material. In top-emission type organic light emitting display apparatus, substrate 100 may be formed of a metal. If substrate 100 is formed of a metal, substrate 100 may include at least one selected from the group consisting of carbon, iron, chrome, manganese, nickel, titanium, molybdenum, stainless steel (SUS), an Invar alloy, an Inconel alloy, and a Kovar alloy. The present invention is however not limited thereto, and substrate 100 may be formed of a metal foil.

Display unit 200 is formed on substrate 100. Display unit 200 includes an organic light emitting device 110 in order to emit visible light. Organic light emitting device 110 (see FIG. 3B) includes an organic light emitting layer 112 and two electrodes 111 and 113 in immediate contact with organic light emitting layer 112. If voltages are applied to the two electrodes 111 and 113, organic light emitting layer 112 generates visible light. The configuration of display unit 200 will be explained later in detail.

Touch panel 300 is formed on display unit 200. Touch panel 300 is used as an input device that can detect a user's touch, and is also used to seal display unit 200. Substrate 100 and touch panel 300 are bonded to each other by using a sealant 150. Sealant 150 may be formed of glass frit. Alternatively, sealant 150 may be formed of an organic material, an inorganic material, or a mixture of an organic material and an inorganic material.

Referring to FIG. 2, touch panel 300 includes a sealing substrate 301, a ground layer 305, a first pattern layer 310, a second pattern layer 320, a first insulating layer 330, and a second insulating layer 340.

Sealing substrate 301 may face a surface of substrate 100. Sealing substrate 301 is formed of a transparent material that can protect display unit 200 from external moisture or oxygen. To this end, sealing substrate 301 may be formed of glass or plastic, or may have a structure in which organic and inorganic materials are stacked.

Ground layer 305 is formed on a surface of sealing substrate 301 opposite to a surface of sealing substrate 301 facing display unit 200. Ground layer 305 that is touchable by the user's hand enables touch panel 300 maintaining a constant voltage level. When touch panel 300 is a capacitive touch panel, when touch panel 300 maintains a constant voltage level, the user's touch can be detected with high precision.

First pattern layer 310, the first insulating layer 330, the second pattern layer 320, and the second insulating layer 340 are sequentially formed on the surface of sealing substrate 301 with the surface facing display unit 200.

The first pattern layer 310 includes a plurality of first pads 311a and second pads 312a each of which are parallel to one another in one predetermined direction, for example direction X or direction Y as shown in FIG. 5B. The first insulating layer 330 is formed of an insulating material in order to electrically insulate the first pattern layer 310 from the second pattern layer 320. The first insulating layer 330 has contact holes 331, and the second pattern layer 320 is electrically connected to the plurality of second pads 312a through the contact holes.

The second insulating layer 340 is formed of an electrical insulating material to cover the second pattern layer 320. The configuration of touch panel 300 will be explained in detail with reference to FIGS. 4 through 9B.

FIGS. 3A through 9B are cross-sectional views illustrating a method of manufacturing organic light emitting display apparatus 1000 of FIG. 1, according to an embodiment of the present invention.

Figure 3A:
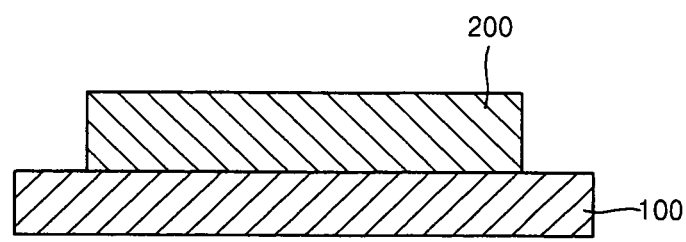

Referring to FIG. 3A, substrate 100 having the surface on which display unit 200 is formed is prepared. Organic light emitting device 110 of display unit 200 may be of an active matrix (AM) type or a passive matrix (PM) type.

Figure 3B:
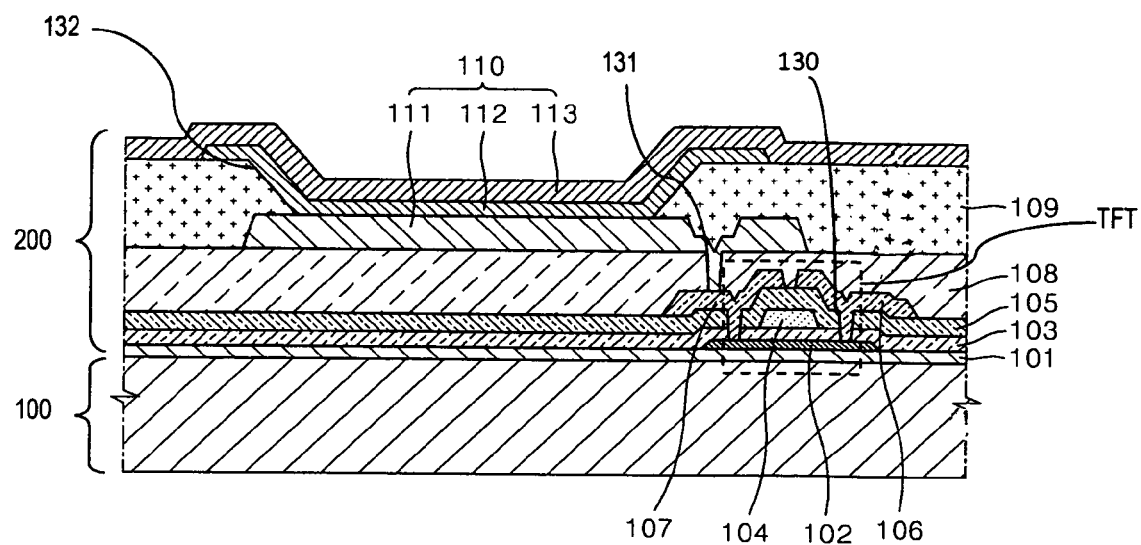

FIG. 3B illustrates display unit 200. In FIG. 3B, only one sub-pixel of display unit 200 is illustrated, and organic light emitting device 110 of display unit 200 is of an AM type for convenience of explanation.

The present invention is however not limited thereto, and organic light emitting device 110 of display unit 200 may be of a PM type.

Referring to FIG. 3B, a buffer layer 101 may be formed on the surface of substrate 100 in order to flatten the surface of substrate 100 and to prevent impurities from penetrating into substrate 100. Buffer layer 101 may be formed of $SiO_2$ and/or SiNx.

A thin film transistor (TFT) is formed on buffer layer 101. At least one TFT is formed at each sub-pixel. The TFT is electrically connected to organic light emitting device 110 and functions as a driving circuit unit. For convenience of explanation, FIG. 3B illustrates one sub-pixel, and one TFT functioning as a driving circuit unit for the one sub-pixel.

In detail, an active layer 102 having a predetermined pattern is formed on buffer layer 101. Active layer 102 may be formed of an organic semiconductor or an inorganic semiconductor such as amorphous silicon or polysilicon, and includes a source region, a drain region, and a channel region.

The source region and the drain region of active layer 102 may be formed by doping active layer 102 that is formed of amorphous silicon or polysilicon with impurities. If active layer 102 is doped with born (B), which is a Group III element, a p-type semiconductor may be formed, and if active layer 102 is doped with nitrogen (N), which is a Group V element, an n-type semiconductor may be formed.

A gate insulating layer 103 is formed on active layer 102, and a gate electrode 104 is formed on a predetermined area of gate insulating layer 103. Gate insulating layer 103 for insulating active layer 102 from gate electrode 104 may be formed of an organic material, or an inorganic material such as SiNx or $SiO_2$.

Gate electrode 104 may be formed of a metal, such as Au, Ag, Cu, Ni, Pt, Pd, Al, or Mo, or an alloy, such as Al:Nd or Mo:W. The present invention is however not limited thereto, and gate electrode 104 may be formed of any of various materials in consideration of adhesion to an adjacent layer, the flatness of a stacked layer, electrical resistance, and processability. Gate electrode 104 is connected to a gate line (not shown) that applies a TFT on/off signal.

An interlayer insulating layer 105 having contact holes formed therein is formed on gate electrode 104. A source electrode 106 and a drain electrode 107 respectively contact the source region and the drain region of active layer 102 through contact holes 130 of interlayer insulating layer 105. Each of source electrode 106 and drain electrode 107 may be formed of Au, Pd, Pt, Ni, Rh, Ru, Ir, Os, Al, Mo, or an alloy, such as Al:Nd or MoW, and the present invention is not limited thereto.

A passivation layer 108 covers and protects the TFT formed as described above. Passivation layer 108 may be an inorganic insulating layer and/or an organic insulating layer. The inorganic insulating layer may include $SiO_2$, SiNx, SiON, $Al_2O_3$, $TiO_2$, $Ta_2O_5$, $HfO_2$, $ZrO_2$, BST, or PZT, and the organic insulating layer may include a general polymer, such as poly(methyl methacrylate) (PMMA) or polystyrene (PS), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, or a blend thereof. Passivation layer 108 may have a structure in which inorganic and organic insulating layers are stacked.

A via hole 131 is formed in passivation layer 108 so that drain electrode 107 is exposed through via hole 131. Next, organic light emitting device 110 is formed. Organic light emitting device 110 includes the first electrode 111, intermediate layer 112, and the second electrode 113. The first electrode 111 is electrically connected to drain electrode 107 through via hole 131.

Next, a pixel-defining layer 109 formed of an insulating material is formed to cover the first electrode 111. A predetermined opening 132 through which the first electrode 111 is exposed is formed in pixel-defining layer 109. Intermediate layer 112 is formed on an area of the first electrode 111 defined by predetermined opening 132. The second electrode 113 of organic light emitting device 110 is formed to cover all pixels.

If organic light emitting display apparatus 1000 is of a top-emission type in which an image is formed on a side opposite to substrate 100, the first electrode 111 may be a reflective electrode, and the second electrode 113 may be a transparent electrode. If the first electrode 111 is a reflective electrode, the first electrode 111 is formed of Ag, Mg, Al, Pt, Pd, Au, Ni, Nd, Ir, Cr, Li, Ca, or a compound thereof.

The second electrode 113 is formed of a metal having a low work function, such as Ag, Mg, Al, Pt, Pd, Au, Ni, Nd, Ir, Cr, Li, Ca, or a compound thereof. In order to reduce resistance, an auxiliary electrode layer or a bus electrode line formed of a transparent conductive material, such as indium tin oxide (ITO), indium zinc oxide (IZO), zinc oxide (ZnO), aluminum-doped zinc oxide (AZO), or indium oxide (In2O3), may be formed on the second electrode 113.

If organic light emitting display apparatus 1000 is of a double-emission type, both the first electrode 111 and the second electrode 113 may be transparent electrodes.

If organic light emitting display apparatus 100 is of a bottom-emission type in which an image is formed on substrate 100, the first electrode 111 may be a transparent electrode and the second electrode 113 may be a reflective electrode. The first electrode 111 may be formed of ITO, IZO, ZnO, AZO, or $In_2O_3$, which has a high work function, and the second electrode 113 may be formed of a metal having a low work function such as Ag, Mg, Al, Pt, Pd, Au, Ni, Nd, Ir, Cr, Li, or Ca.

The present invention is however not limited thereto, and each of the first electrode 111 and the second electrode 113 may be formed of a conductive organic material, or a conductive paste including conductive particles such as Ag, Mg, or Cu.

Intermediate layer 112 interposed between the first electrode 111 and the second electrode 113 includes an organic light emitting layer generating visible light. Intermediate layer 112 emits light when voltages are applied to the first electrode 111 and the second electrode 113.

If the organic light emitting layer of intermediate layer 112 is formed of a low molecular organic material, a hole transport layer (HTL) and a hole injection layer (HIL) are stacked between the organic light emitting layer and the first electrode 111, and an electron transport layer (ETL) and an electron injection layer (EIL) are stacked between the organic light emitting layer and second electrode 113. If necessary, various layers may be stacked without deviating from the principle of the present invention. The low molecular organic material of the organic light emitting layer may be copper phthalocyanine (CuPc), (N,N'-Di(naphthalene-1-yl)-N,N'-diphenylbenzidine: NPB), tris-8-hydroxyquinoline aluminum (Alq3), or the like.

If the organic light emitting layer of intermediate layer 112 is formed of a high molecular organic material, only an HTL may be formed between the organic light emitting layer and the first electrode 111. The HTL may be formed of poly-(2, 4)-ethylene-dihydroxy thiophene (PEDOT) or polyaniline (APNI) on the first electrode 111 using inkjet printing or spin coating. The organic light emitting layer may be formed of PPV, soluble PPVs, cyano-PPV, or polyfluorene. A color pattern may be formed by inkjet printing, spin coating, or thermal transfer using a laser.

Next, touch panel 300 facing display unit 200 is prepared. A process of manufacturing the touch panel 300 will now be explained in detail.

Figure 4:
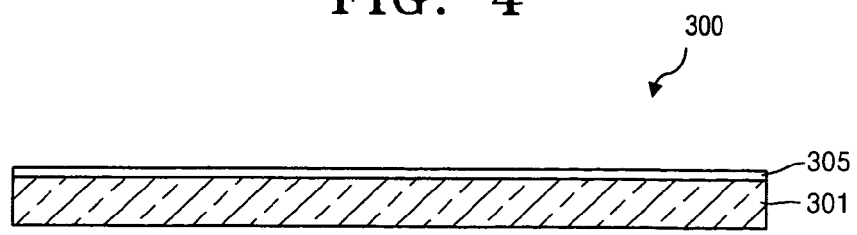

Referring to FIG. 4, ground layer 305 is formed on sealing substrate 301.

Ground layer 305 is a transparent conductive layer. Ground layer 305 may be formed of ITO, IZO, ZnO, AZO, or $In_2O_3$ and crystallized.

Once ground layer 305 is crystallized, the durability of ground layer 305 is improved. Since ground layer 305 is exposed to the exterior and is frequently touched by the user, ground layer 305 tends to be damaged. If a transparent conductive layer is crystallized to form ground layer 305, however, the strength of the transparent conductive layer is improved and the durability of the transparent conductive layer against external impact is improved.

The transparent conductive layer may be crystallized in various ways. For example, the transparent conductive layer formed of ITO may be thermally treated at a temperature of 150° C. or higher. A grain size of ground layer 305 in this case is more than 1000 Å.

Referring to FIGS. 5A and 5B, the first pattern layer 310 is formed on the surface of sealing substrate 301 opposite to the surface of the sealing substrate on which the ground layer 305 is formed. FIG. 5B is a plan view as seen in direction A of FIG. 5A, and FIG. 5A is a cross-sectional view taken along direction Y of FIG. 5B.

The first pattern layer 310 includes a plurality of first direction pattern units 311, which are parallel to one another in a first direction (direction X of FIG. 5B), and a plurality of second direction pattern units 312, which are parallel to one another in a second direction (direction Y of FIG. 5B). As shown in FIGS. 5A and 5B, the first direction pattern units 311 and the second direction pattern units 312 alternate with each other. That is, the plurality of first direction pattern units 311 are formed in parallel to one another on the sealing substrate 301 in the first direction (direction X of FIG. 5A) with their vertexes close to each other, and the plurality of second direction pattern units 312 are formed in parallel to one another in the second direction (direction Y of FIG. 5B) with their vertexes close to each other between the plurality of first direction pattern units 311.

Referring to dash line B of FIG. 5B indicating one of the first direction pattern units 311, each of the first direction pattern units 311 includes the plurality of first pads 311a, a plurality of first connections 311b, and a first extension 311c.

Each of the plurality of first pads 311a substantially has a diamond shape, and the plurality of first pads 311a are aligned in direction X of FIG. 5A. Each of the first connections 311b is formed between adjacent first pads of the plurality of first pads 311a and connects the adjacent first pads. The first extensions 311c extend from one ends of the first direction pattern units 311. The first extensions 311c extend in one direction, for example, in direction Y of FIG. 5A, so that the first extensions 311c are gathered at an upper portion of sealing substrate 301 as shown in FIG. 5B. In a subsequent process, first connecting units (not shown) are formed on ends of the first extensions 311c.

Referring to a dash line C of FIG. 5B indicating one of the second direction pattern units 312, each of the second direction pattern units 312 includes a plurality of second pads 312a and a second extension 312c. Each of the second pads 312a substantially has a diamond shape, and the second pads 312a are aligned in the second direction, for example, in direction Y of FIG. 5B.

Unlike the first direction pattern units 311, the second pattern units 312 do not include connections. The second pads 312a are connected to one another by the second pattern layer 320. The second extensions 312c extend from one ends of the second direction pattern units 312. The second extensions 312c extend in one direction, for example, in direction Y of FIG. 5B, and are gathered at the one end of the sealing substrate 301 as shown in FIG. 5B.

The first pattern layer 310 may be formed of a transparent material such as ITO, IZO, ZnO, AZO, or $In_2O_3$. The first pattern layer 310 may be formed by using photolithography. That is, the first pattern layer 310 may be formed by patterning an ITO layer formed using deposition, spin coating, sputtering, or inkjet printing. An etching process for patterning the first pattern layer 310 may be wet etching. If an etchant is used to etch ITO of the first pattern layer 310, since the ground layer 305 also includes ITO, the ground layer 305 may be etched undesirably.

However, since ground layer 305 is crystallized through thermal treatment, ground layer 305 is not etched by the etchant. Hence, while wet etching is performed in order to form the first pattern layer 310, ground layer 305 is not damaged even though ground layer 305 is exposed to the etchant.

Figure 6:
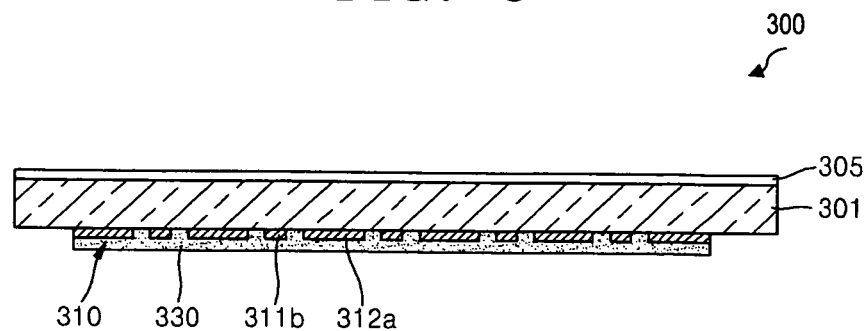

Referring to FIG. 6, the first insulating layer 330 is formed. The first insulating layer 330 is formed on the surface of the sealing substrate 301 facing the substrate 100 so as to cover the first pattern layer 310. The first insulating layer 330 electrically insulates the first pattern layer 310 from the second pattern layer 320. The first insulating layer 330 may be formed of one of various materials. The first insulating layer 330 may be formed of an organic material or an inorganic material, for example, a silicon oxide ($SiO_2$).

Figure 7A:
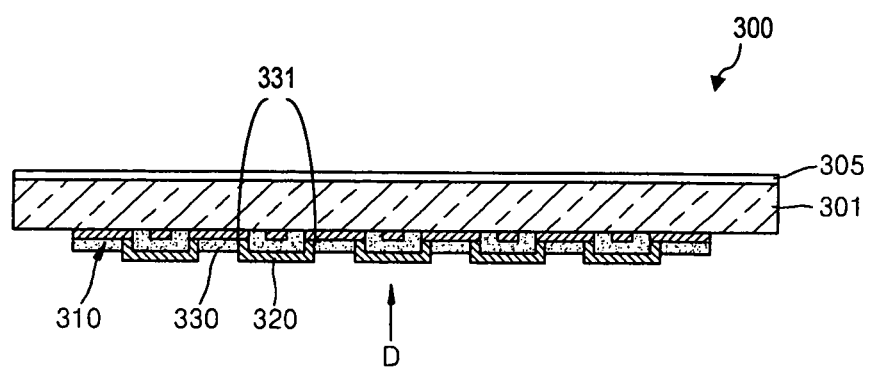
Figure 7B:
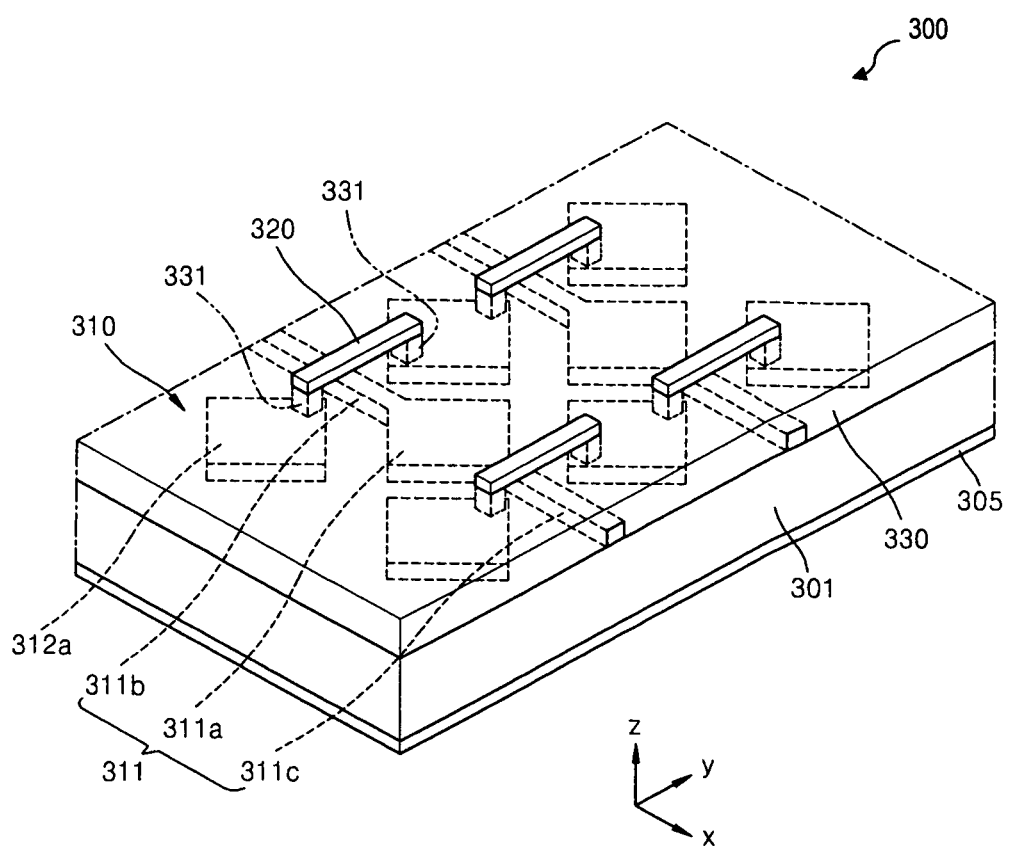
Figure 7C:
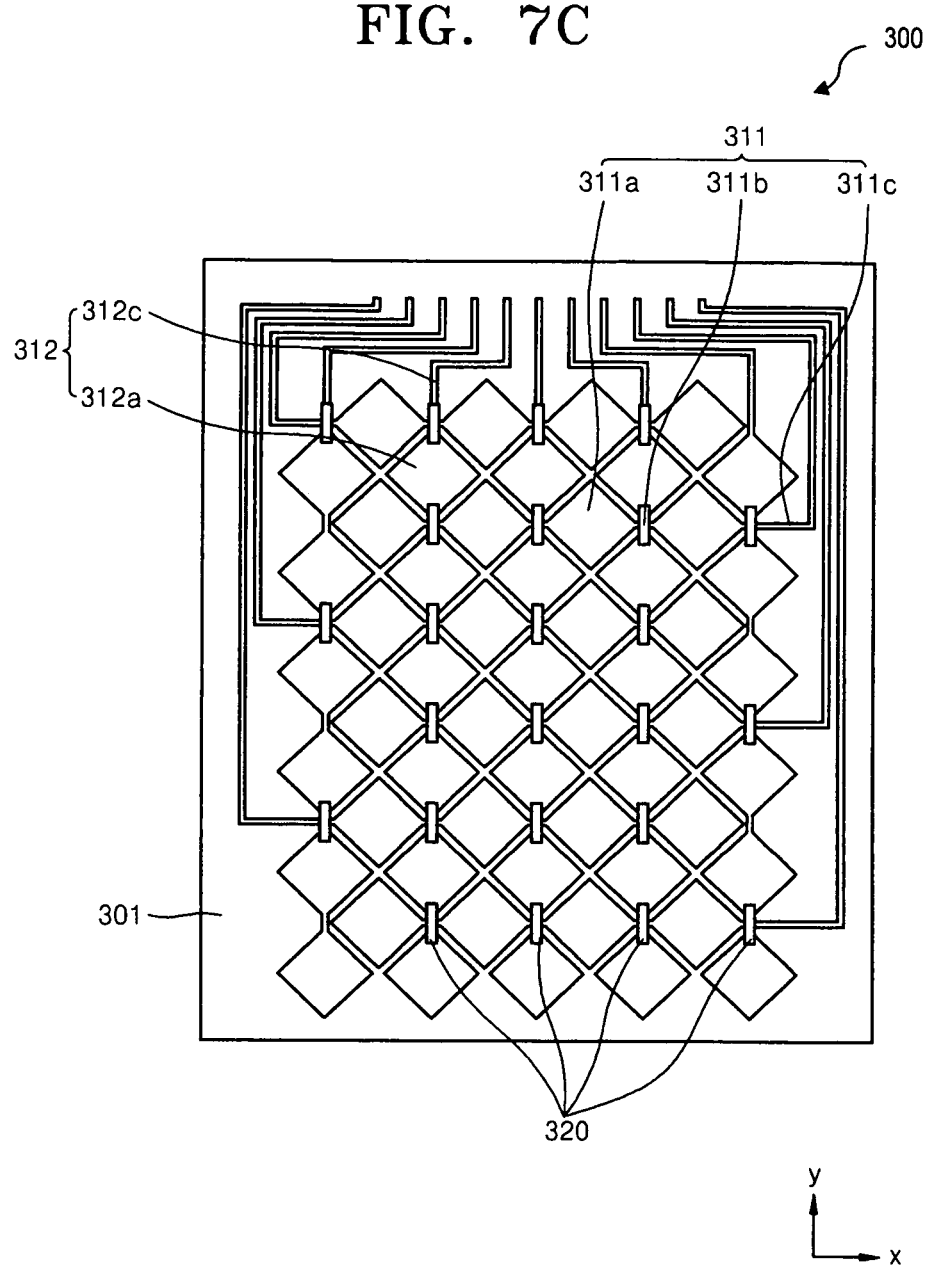

Referring to FIGS. 7A through 7C, the second pattern layer 320 is formed on the first insulating layer 330. FIG. 7A is a cross-sectional view illustrating the second pattern layer 320. FIG. 7B is a perspective view illustrating the second pattern layer 320. FIG. 7C is a plan view as seen in direction D of FIG. 7A. FIG. 7A is a cross-sectional view taken along direction Y of FIG. 7C.

Referring to FIG. 7B, contact holes 331 are formed in predetermined positions of the first insulating layer 330 corresponding to vertexes of adjacent second pads of the second pads 312a of the second direction pattern units 312.

The second pattern layer 320 is connected to the second pads 312a of the second direction pattern units 312 through the contact holes 331.

Referring to FIGS. 7A through 7C, the second pattern layer 320 is formed on a surface of the first insulating layer 330 facing the substrate 100. The second pattern layer 320 fills the contact holes 331 of the first insulating layer 330, and electrically connects with adjacent second pads of the second pads 312a of the second direction pattern units 312.

Accordingly, even though the first direction pattern units 311 are formed in the first direction, and the second direction pattern units 312 are formed in the second direction that is perpendicular to the first direction, the first direction pattern units 311 and the second direction pattern units 312 do not cross each other and thus a shortcircuit between the first direction pattern units 311 and the second direction pattern units 312 can be prevented.

For example, the second pattern layer 320 may be formed of a transparent material such as ITO, IZO, ZnO, AZO, or $In_2O_3$. Each of the first pattern layer 310 and the second pattern layer 320 may be formed by using photolithography. That is, each of the first pattern layer 310 and the second pattern layer 320 may be formed by patterning an ITO layer formed using deposition, spin coating, sputtering, or inkjet printing.

Like the first pattern layer 310, the second pattern layer 320 may be patterned by using wet etching. Since the ground layer 305 is crystallized, even though ground layer 305 is exposed to an etchant, ground layer 305 is not damaged due to the wet etching.

Optionally, the second pattern layer 320 may be first formed and then the second pattern layer 320 may be crystallized. If the second pattern layer 320 is crystallized, even though the second pattern layer 320 is exposed to a wet etchant in a subsequent process, the second pattern layer 320 is not damaged. Accordingly, the subsequent process can be performed in various ways according to conditions without deviating from the principle of the present invention.

The second pattern layer 320 may be crystallized in various ways. For example, the second pattern layer 320 may be thermally treated at a temperature of 150° C. In this case, a grain size of the second pattern layer 320 is more than 1000 Å.

Figure 8:
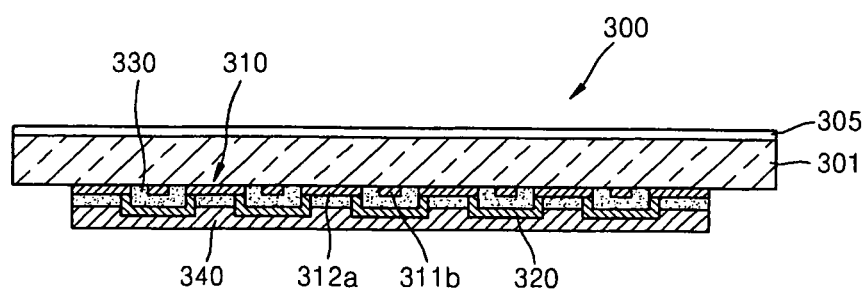

Referring to FIG. 8, the second insulating layer 340 is formed. The second insulating layer 340 is formed on the surface of the first insulating layer 330 facing substrate 100 so as to cover the second pattern layer 320. The second insulating layer 340 electrically insulates the second pattern layer 320 from display unit 200.

Figure 9A:
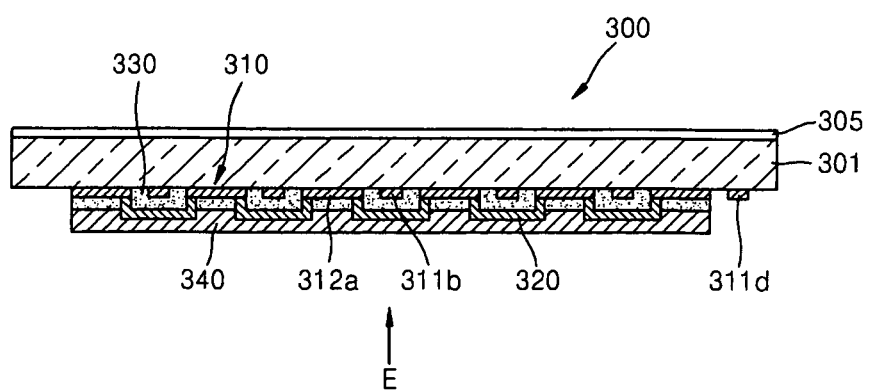
Figure 9B:
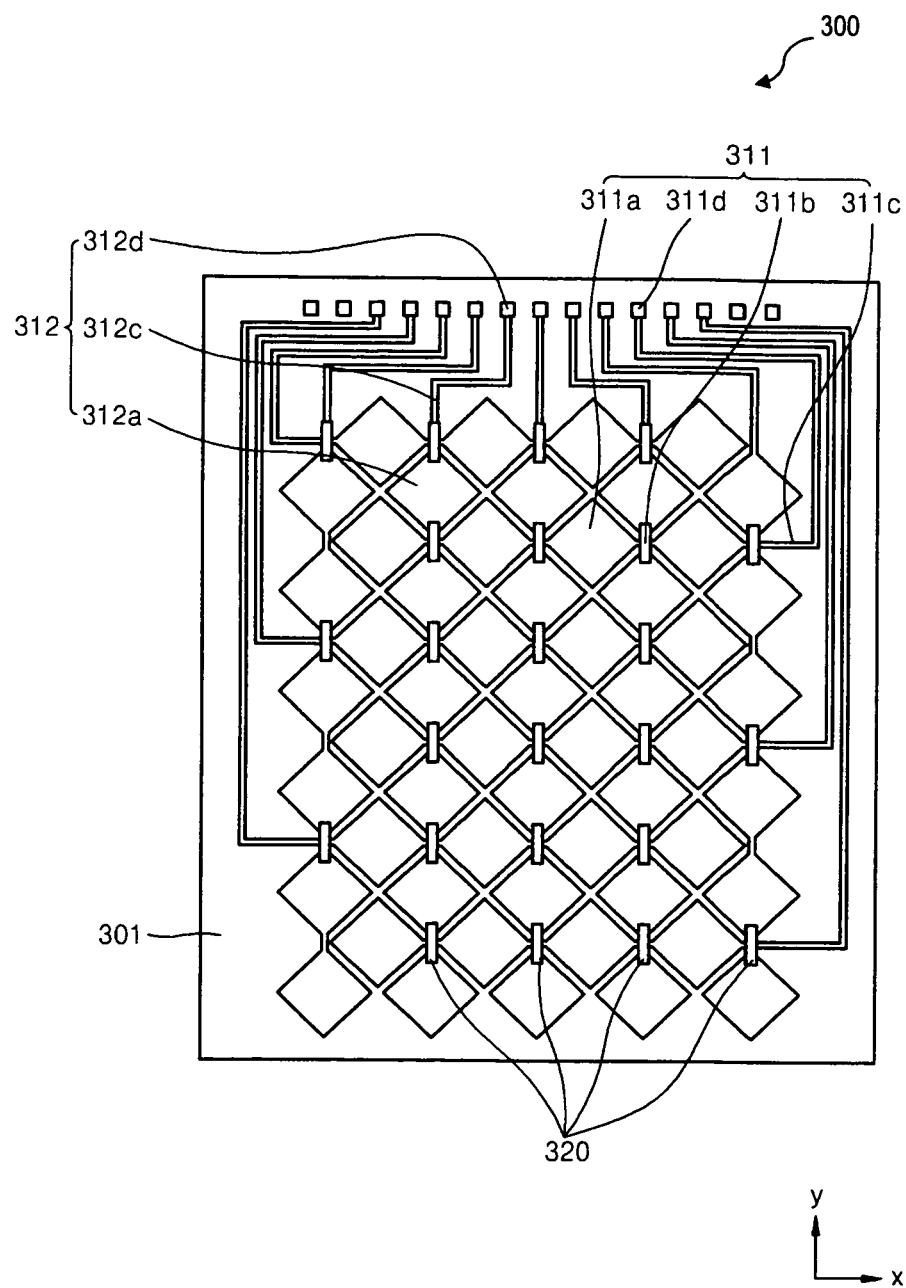

Referring to FIGS. 9A and 9B, first connecting units 311d and second connecting units 312d are formed. FIG. 9A is a cross-sectional view illustrating the first connecting units 311d and the second connecting units 312d. FIG. 9B is a plan view as seen in direction E of FIG. 9A.

Referring to FIGS. 9A and 9B, the first connecting units 311d are formed on ends of the first extensions 311c. The first connecting units 311d may be electrically connected to data lines of display unit 200 formed on substrate 100 through a conductor.

The second connecting units 312d are formed on ends of the second extensions 312c. The second connecting units 312d may be connected to the data lines of display unit 200 formed on substrate 100 through the conductive member, like the first connecting units 311d.

Each of the first connecting units 311d and the second connecting units 312d may be formed of a metal having a low resistance. Each of the first connecting units 311d and the second connecting units 312d may include any one selected from the group consisting of Mo, a Mo alloy, Al, and Ti.

Each of the first connecting units 311d and the second connecting units 312d may have a structure in which three layers of Ti/Al/Ti are stacked, or three layers of Mo/Al/Mo are stacked. Accordingly, each of the first connecting units 311d and the second connecting units 312d may have a low resistance that is less than 0.3Ω. The first connecting units 311d and the second connecting units 312d may be easily patterned by dry etching using plasma.

Alternatively, each of the first connecting units 311d and the second connecting units 312d may include Mo or a Mo alloy. In this case, the first connecting units 311d and the second connecting units 312d may be patterned by wet etching using an etchant. In particular, since ground layer 305 is crystallized, the first connecting units 311d and the second connecting units 312d can be easily patterned without damaging ground layer 305. Also, as described above, if the second pattern layer 320 is crystallized, since the second pattern layer 320 is not damaged by a wet etchant, the first connecting units 311d and the second connecting units 312d may be formed and patterned before the second insulating layer 340 is formed.

Next, substrate 100 including display unit 200 and touch panel 300 are coupled to each other using sealant 150 to form organic light emitting display apparatus 1000 as shown in FIG. 1. That is, substrate 100 and sealing substrate 301 are coupled to each other so that the first pattern layer 310 and the second pattern layer 320 of sealing substrate 301 face display unit 200 formed on substrate 100.

If an object, such as the user's finger, touches the surface of organic light emitting display apparatus 1000, that is, touch panel 300, organic light emitting display apparatus 1000 analyzes and detects a change in capacitance caused by the touch, and then outputs the coordinates and pressure of the touch. To be more specific, as a constant voltage, a cathode voltage flows in the second electrode 113 (see FIG. 3b) of display unit 200 which contacts the second insulating layer 340. Thus, the first pattern layer 310 and the second electrode 113 form one capacitor, and an electrostatic capacity between the first pattern layer 310 and the second electrode 113 is maintained constant. At this time, if a finger, a conductive object, or a high dielectric object approaches or touches a surface above touch panel 300, the finger and the first pattern layer 310 form another capacitor. Thus, these two capacitors are connected in series, and an entire electrostatic capacity changes. By using the position where the change of the electrostatic capacity occurs and a magnitude of the change, a touch sensing system starts operating.

Organic light emitting display apparatus 1000 can perform a touch panel function without increasing the total thickness of the display apparatus. Since an electrostatic capacity pattern is formed on the inner surface of sealing substrate 301, slim etching can be used and the first and second pattern layers 310 and 320 can be easily formed.

Figure 10:
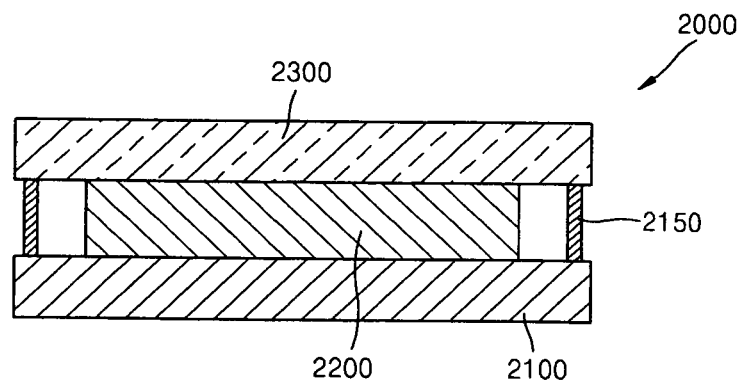
FIG. 10 is a cross-sectional view of an organic light emitting display apparatus constructed as another embodiment of the present invention.
Figure 11:
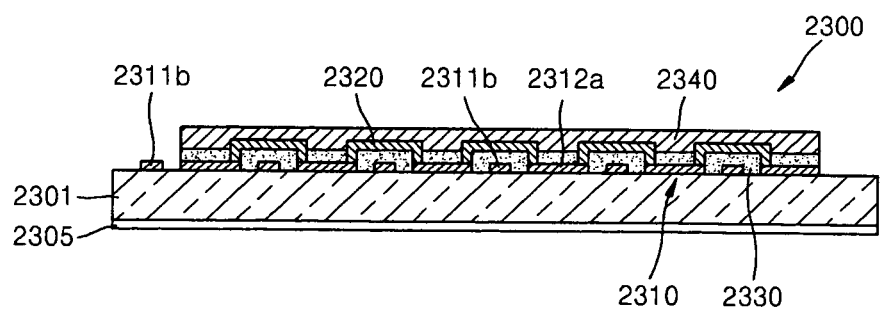
FIG. 11 is an enlarged cross-sectional view of a touch panel of the organic light emitting display apparatus as shown in FIG. 10.

FIG. 10 is a cross-sectional view of an organic light emitting display apparatus 2000 according to another embodiment of the present invention. FIG. 11 is an enlarged cross-sectional view of a touch panel 2300 of organic light emitting display apparatus 2000 of FIG. 10. For convenience of explanation, the following explanation will be made by focusing on a difference between organic light emitting display apparatus 1000 of FIG. 1 and organic light emitting display apparatus 2000 of FIG. 10.

Organic light emitting display apparatus 2000 includes a substrate 2100, a display unit 2200, and touch panel 2300. Substrate 2100 and touch panel 2300 are bonded to each other by using a sealant 2150.

Organic light emitting display apparatus 2000 is different from the organic light emitting display apparatus 100 in terms of the configuration of touch panel 2300. Referring to FIG. 11, the position of a ground layer 2305 of the touch panel 2300 is different from the position of ground layer 305 of touch panel 300. That is, ground layer 2305 of the touch panel 2300 is formed on a surface of a sealing substrate 2301 facing display unit 2200.

Since ground layer 2305 enables touch panel 2300 maintaining constant voltage, the user's touch can be detected with high precision.

A first pattern layer 2310, a first insulating layer 2330, a second pattern layer 2320, and a second insulating layer 2340 are sequentially formed on a surface of sealing substrate 2301 opposite to the surface of the sealing substrate 2301 facing the display unit 2200.

The configuration and the manufacture of ground layer 2305, the first pattern layer 2310, the second pattern layer 2320, the first insulating layer 2330, and the second pattern layer 2340 are similar to those of the ground layer 305, the first pattern layer 310, the second pattern layer 320, the first insulating layer 330, and the second pattern layer 340, respectively, and thus a detailed explanation thereof will not be given.

As described above, an organic light emitting display apparatus and a method of manufacturing the same according to the present invention can easily perform a touch panel function.

While the present invention has been particularly shown and described with reference to exemplary embodiments thereof, it will be understood by those of ordinary skill in the art that various changes in form and details may be made therein without departing from the spirit and scope of embodiments of the present invention as defined by the following claims.

What is claimed is:

1. An organic light emitting display apparatus, comprising:
    a substrate;
    a display unit formed on the substrate and comprising an organic light emitting device; and
    a touch panel formed on the display unit,
    wherein the touch panel, comprises:
        a sealing substrate;
        a ground layer formed exclusively on a first surface of the sealing substrate;
        a first pattern layer formed on a second surface of the sealing substrate with the second surface of the sealing substrate being opposite to the first surface of the sealing substrate;
        a first electrical insulating layer formed on the first pattern layer;
        a second pattern layer formed on the first insulating layer; and
        a second electrical insulating layer formed on the second pattern layer.

2. The organic light emitting display apparatus of claim 1, wherein the first surface of the sealing substrate faces the display unit.

3. The organic light emitting display apparatus of claim 1, wherein the second surface of the sealing substrate faces the display unit.

4. The organic light emitting display apparatus of claim 1, wherein the ground layer is crystallized.

5. The organic light emitting display apparatus of claim 1, wherein the second pattern layer is crystallized.

6. The organic light emitting display apparatus of claim 1, wherein each of the first pattern layer, the second pattern layer, and the ground layer comprises a transparent conductive layer.

7. The organic light emitting display apparatus of claim 1, wherein each of the first pattern layer, the second pattern layer, and the ground layer comprises any one selected from the group consisting of indium tin oxide (ITO), indium zinc oxide (IZO), zinc oxide (ZnO), aluminum-doped zinc oxide (AZO), and indium oxide ($In_2O_3$).

8. The organic light emitting display apparatus of claim 1, wherein the first pattern layer comprises a plurality of first pads, a plurality of first connections each connecting adjacent first pads of the plurality of first pads, and a plurality of second pads.

9. The organic light emitting display apparatus of claim 8, wherein the first electrical insulating layer has contact holes formed therein, and the second pattern layer is electrically connected to the plurality of second pads through the contact holes.

10. The organic light emitting display apparatus of claim 1, further comprising connecting units formed on the substrate and electrically connected to the first pattern layer or the second pattern layer,
    wherein each of the connecting units comprises any one selected from the group consisting of Mo, Al, and Ti.

11. A method of manufacturing an organic light emitting display apparatus, the method comprising:
    preparing a substrate on which a display unit including an organic light emitting device is formed; and
    forming a touch panel on the display unit,
    wherein the step of forming of the touch panel further comprises:
        preparing a sealing substrate;
        forming a ground layer exclusively on a first surface of the sealing substrate;
        forming a first pattern layer on a second surface of the sealing substrate with the second surface of the sealing substrate being opposite to the first surface of the sealing substrate;
        forming a first electrical insulating layer on the first pattern layer;
        forming a second pattern layer on the first insulating layer; and
        forming a second electrical insulating layer on the second pattern layer.

12. The method of claim 11, wherein the first surface of the sealing substrate faces the display unit.

13. The method of claim 11, wherein the second surface of the sealing substrate faces the display unit.

14. The method of claim 11, further comprising crystallizing the ground layer between the forming of the ground layer and the forming of the first pattern layer.

15. The method of claim 14, wherein the crystallizing of the ground layer comprises crystallizing the ground layer by using thermal treatment.

16. The method of claim 11, wherein the forming of the first pattern layer comprises patterning the first pattern layer using wet etching.

17. The method of claim 11, further comprising crystallizing the second pattern layer between the forming of the second pattern layer and the forming of the second insulating layer.

18. The method of claim 17, wherein the crystallizing of the second pattern layer comprises crystallizing the second pattern layer by using thermal treatment.

19. The method of claim 11, wherein each of the first pattern layer, the second pattern layer, and the ground layer comprises a transparent conductive layer.

20. The method of claim 11, wherein each of the first pattern layer, the second pattern layer, and the ground layer comprises any one selected from the group consisting of ITO, IZO, ZnO, AZO, and $In_2O_3$.

21. The method of claim 11, wherein the first pattern layer comprises a plurality of first pads, first connections each connecting adjacent first pads of the plurality of first pads, and a plurality of second pads.

22. The method of claim 11, wherein the first insulating layer has contact holes formed therein, and the second pattern layer is connected to the plurality of second pads through the contact holes.

23. The method of claim 11, further comprising forming connecting units on the substrate so that the connecting units are electrically connected to the first pattern layer or the second pattern layer,
wherein each of the connecting units comprises any one selected from the group consisting of Mo, Al, and Ti.

24. The method of claim 23, wherein each of the connecting units is formed by using one of wet etching and dry etching.

25. An organic light emitting display apparatus, comprising:
a substrate;
a display unit disposed between the substrate and a touch panel; and
the touch panel comprising:
a sealing substrate;
a ground layer disposed exclusively on a first surface of the sealing substrate and in immediate physical contact with the first major surface of the sealing substrate; and
a first direction pattern unit and a second direction pattern unit formed on a second major surface of the sealing substrate, with the first direction pattern unit being electrically insulated from the second direction pattern unit by an intermediate electrical insulating layer.

* * * * *